United States Patent [19]
Low et al.

[11] Patent Number: 5,886,398
[45] Date of Patent: Mar. 23, 1999

[54] MOLDED LAMINATE PACKAGE WITH INTEGRAL MOLD GATE

[75] Inventors: Qwai H. Low, Cupertino; Manickam Thavarajah, San Jose; Chok J. Chia; Maniam Alagaratnam, both of Cupertino, all of Calif.

[73] Assignee: LSI Logic Corporation, Milpitas, Calif.

[21] Appl. No.: 938,360

[22] Filed: Sep. 26, 1997

[51] Int. Cl.$^6$ .......................... H01L 23/495; H01L 23/04; H01L 23/28
[52] U.S. Cl. ............................ 257/667; 257/730; 257/787
[58] Field of Search ..................................... 257/667, 730, 257/787

[56] References Cited

U.S. PATENT DOCUMENTS

| | | | |
|---|---|---|---|
| 4,706,105 | 11/1987 | Masuda et al. | 257/787 |
| 5,304,841 | 4/1994 | Negro | 257/667 |
| 5,371,044 | 12/1994 | Yoshida et al. | 437/214 |
| 5,517,056 | 5/1996 | Bigler et al. | 257/666 |
| 5,708,300 | 1/1998 | Woosley et al. | 257/730 |
| 5,780,933 | 7/1998 | Ohmori et al. | 257/788 |
| 5,984,327 | 11/1997 | Nakazawa et al. | 257/667 |

Primary Examiner—Teresa M. Arroyo
Attorney, Agent, or Firm—Fitch, Even, Tabin & Flannery

[57] ABSTRACT

According to the present invention, a semiconductor package is provided. In one version of the invention, the semiconductor package includes a laminated substrate having a semiconductor die mounted on its upper surface, electrical connections between bond pads on the semiconductor die and conductive traces on the substrate, as well as electrical connections between the conductive traces and electrical contacts on the lower surface of the substrate. The semiconductor package also includes a molded covering on the upper surface of the substrate which covers the semiconductor die and the electrical connections. The molded covering has a mold body portion and a mold gate runner which extends from the mold body portion to an edge of the substrate. The mold gate runner is provided with a surface that is substantially even with the edge of the substrate and rises perpendicularly from the upper surface of the substrate.

20 Claims, 7 Drawing Sheets

MOLDED LAMINATE PACKAGE WITH INTEGRAL MOLD GATE

TECHNICAL FIELD

This invention relates generally to the field of semiconductor packaging, and more particularly, to semiconductor packages formed on laminated package substrates, such as ball grid arrays. Still more particularly, the invention relates to improvements in transfer molding plastic encapsulations on laminated semiconductor packages.

BACKGROUND OF THE INVENTION

As the ability to fabricate greater numbers of transistors on a given semiconductor die size increases, the circuits on the die become more complex and require a greater number of external electrical connections. To accommodate the required number of external contacts, semiconductor packages have evolved from lead frame based packages, such as dual-in-line ("DIPs") and quad-flat-pack ("QFP") packages, to laminated substrate based packages, such as ball grid arrays ("BGA").

Figure 1:
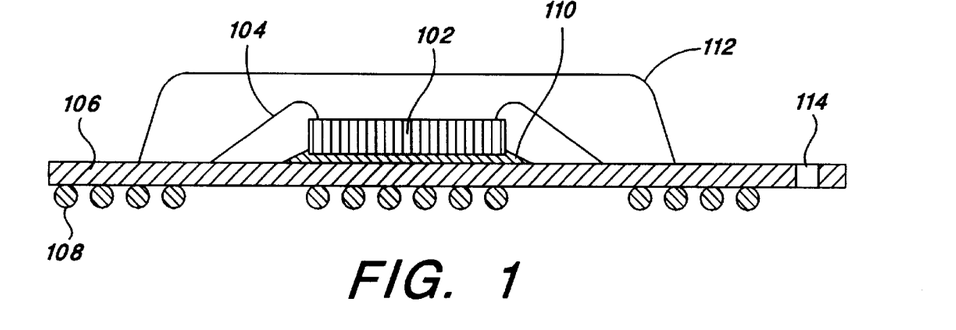
FIG. 1 is a cross-sectional view of a conventional ball grid array semiconductor package.

FIG. 1 is a cross-sectional view of a conventional BGA package. As shown, the package comprises a laminated substrate 106 formed of, for example, a ceramic or plastic material such as epoxy-glass. Electrically conductive traces (not shown) are formed on conductive layers of the substrate 106. Methods for forming conductive traces are known in the art. For example, photo-lithographic techniques may be used to image a desired pattern into a photo-resist material disposed on a conductive layer of the substrate 106. The photoresist material is then "developed," i.e., the photoresist material not exposed by the image, is removed, thereby creating a corresponding pattern of exposed conductive material on the substrate. The exposed conductive material is then removed in an etching process. Finally, the remaining photoresist material is removed, leaving the desired pattern of conductive material on the substrate.

Electrical connections between the layers are formed by conductive vias, such as via 114. Vias are formed in the substrate by known techniques, such as mechanical or laser drilling. After the via is created, it is plated with a conductive material to provide the desired electrical contact. A plurality of electrical contacts to the conductive traces of the package are provided on the lower surface of the package substrate 106. Solder balls 108 are attached to each of the contacts to allow electrical connection between the semiconductor package and external electronic components, such as printed wire boards. Solder balls 108 are conventional and typically are constructed from a lead-tin alloy and are attached to the contacts by well known methods such as re-flow soldering. Of course, other conventional electrical connectors could be substituted for the solder balls 108, such as conductive pins attached to contacts on the lower surface of substrate 106.

A semiconductor die 102 is mounted to the upper surface of the package substrate 106 by a suitable die attach material 110, such as epoxy. Electrical connection between bond pads on the die 102 and the conductive traces on the substrate 106 is provided by bond wires 104. Of course, in addition to the bond wires shown, different methods of providing electrical connections from the die to the package are also well known in the art, such as wire bonding and C4, or "flip-chip" techniques.

All semiconductor packages must not only provide for a number of electrical connections to be made from bond pads on a semiconductor die to external contacts on the package, but must also provide physical protection to prevent damage to the die during handling. To protect the die 102 and bond wires 104, a molded covering 112 is formed on the substrate 106. Generally, molded covering 112 is formed on the package by a transfer or injection molding process. Conventional transfer molding processes are known to those of skill in the art and are described in, for example, U.S. Pat. No. 5,635,671, issued to Freyman et al., incorporated herein by reference. This is explained in greater detail with respect to FIG. 2.

Figure 2:
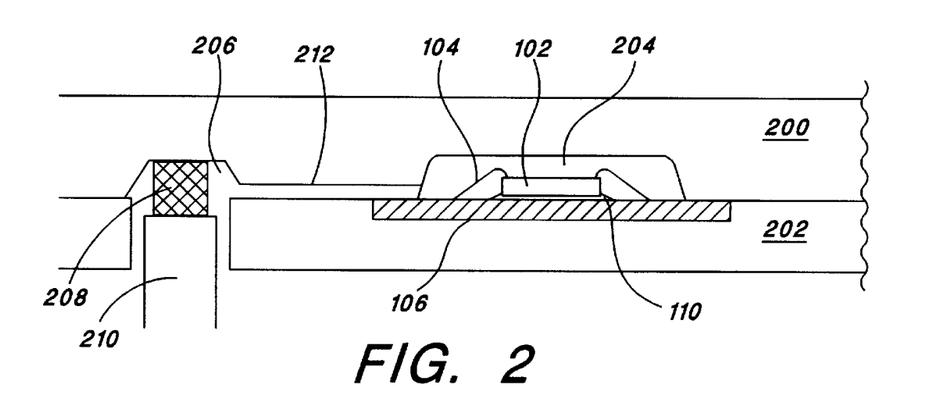
FIG. 2 is a cross-sectional view of a molding apparatus for providing the molded body on top of the conventional BGA package shown in FIG. 1.

FIG. 2 is a cross-sectional view of a conventional two-piece mold. In this case, the mold comprises an upper mold section 200 which is adapted to mate with a lower mold section 202. The lower mold 202 has a recess formed therein for receiving and holding the semiconductor package during the molding process. The semiconductor package is conventional and includes a package substrate 106 having a semiconductor die 102 mounted thereon by means of a die attach material 110. Electrical connection between the die 102 and the substrate 106 is provided by bond wires 104. Lower mold section 202 also has an opening formed therein for receiving a transfer ram 210. The transfer ram 210 is slideably inserted into an opening in lower mold section 202 to force molding material into the cavity 204 as will be discussed in greater detail herein.

A cavity 204 is formed in the upper mold section 200 such that when the mold sections are placed together the cavity 204 is disposed over the die 102 and bond wires 104. As seen from the figure, the shape of the cavity 204 controls the shape of the molded covering. It will also be noted that the sides of the cavity 204 are provided with a slight slope to make removal of the package from the mold easier. Upper mold section 200 is also provided with a cavity 206 which is designed to receive the molding material 208. Cavity 206 is sometimes referred to as the "pot." Molding material 208 is generally a plastic material which hardens upon curing. A channel 212 is formed in upper mold section 200 which connects the pot 206 to the cavity 204. The channel 212 is sometimes referred to as the "runner" channel.

It will be understood by those of skill in the art that the mold sections are generally designed to fit within a frame, referred to as a "chase", during the molding process. The mold sections are often formed as separate removable units, referred to as "bars". The bar which corresponds to the upper mold section will be referred to herein as the "cavity bar". A multiplicity of mold cavities, such as cavity 204, are machined into the cavity bar to allow molding of several packages at once. The mold bars are typically removable from the chase so that the same chase can be used to mold packages of different sizes by simply substituting different mold bars. Similarly, a multiplicity of pots are also often formed on a separate bar, referred to as a "runner bar", to allow substitution of different pots for different packaging applications.

To facilitate simultaneous molding of a number of packages, individual substrates are provided on a substrate strip which contains multiple substrates which are later separated or "singulated", after the molding process. This is described in greater detail with respect to FIGS. 3A–3B.

Figure 3A:
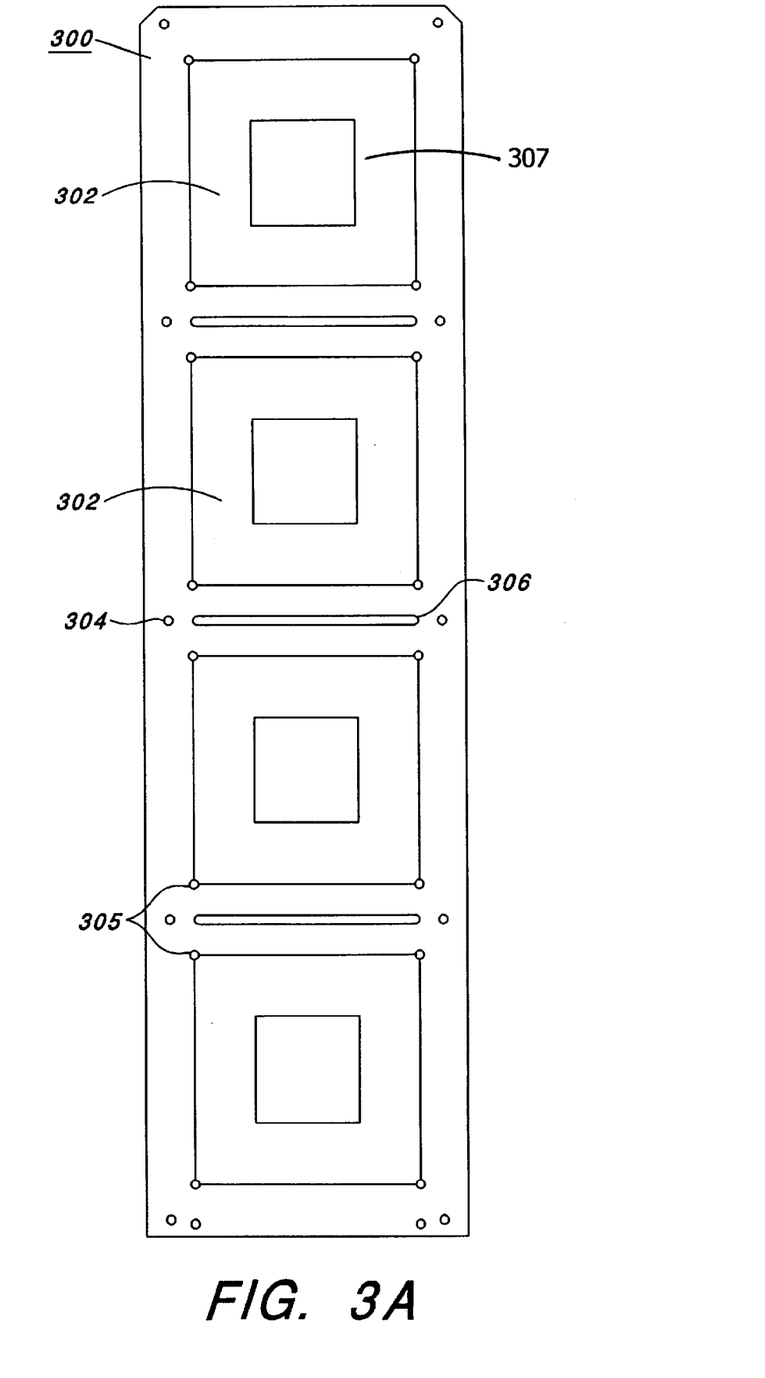
FIG. 3A is a top view of a conventional substrate strip.

FIG. 3A is a top view of a substrate strip 300. Substrate strip 300 contains four substrates, 302 (for simplicity, only two substrates are denoted by the number 302). Substrate strip 300 is also provided with a number of tooling holes, such as tooling hole 304, around its outer perimeter to allow the substrate strip 300 to be attached to other devices in the molding process, such as the cavity bars. Slots 306 are formed on substrate strip 300 between each of the substrates 302. Slots 306 operate to provide stress relief to the strip 300 to reduce or prevent warping during the molding process. Punching holes 305 are also provided on strip 300 at the corner of the substrates 302. Punching holes 305 are useful during the singulation process to reduce or prevent rough edges from being created on the substrates when they are punched out of the strip. Each substrate 302 is provided with a die attach area 307 to allow attachment of a semiconductor die (not shown) to the substrate 302. The die is attached both mechanically, by for example, die attach material, and electrically, by for example, bond wires or flip-chip solder ball connections.

It will be understood that substrates 302 are substantially the same as substrate 106 shown in FIG. 1 in that they are formed from a laminate material and are provided with conductive traces and vias, as discussed previously. The opposite side of strip 300 (not shown) is provided with conductive regions intended to provide electrical connection between conductive traces on the substrate and corresponding electrical contacts on external circuitry, such as printed wire boards ("PWB"). Such electrical connections are often referred to as second level interconnects and are implemented by, for example, solder balls as shown in FIG. 1.

Figure 3B:
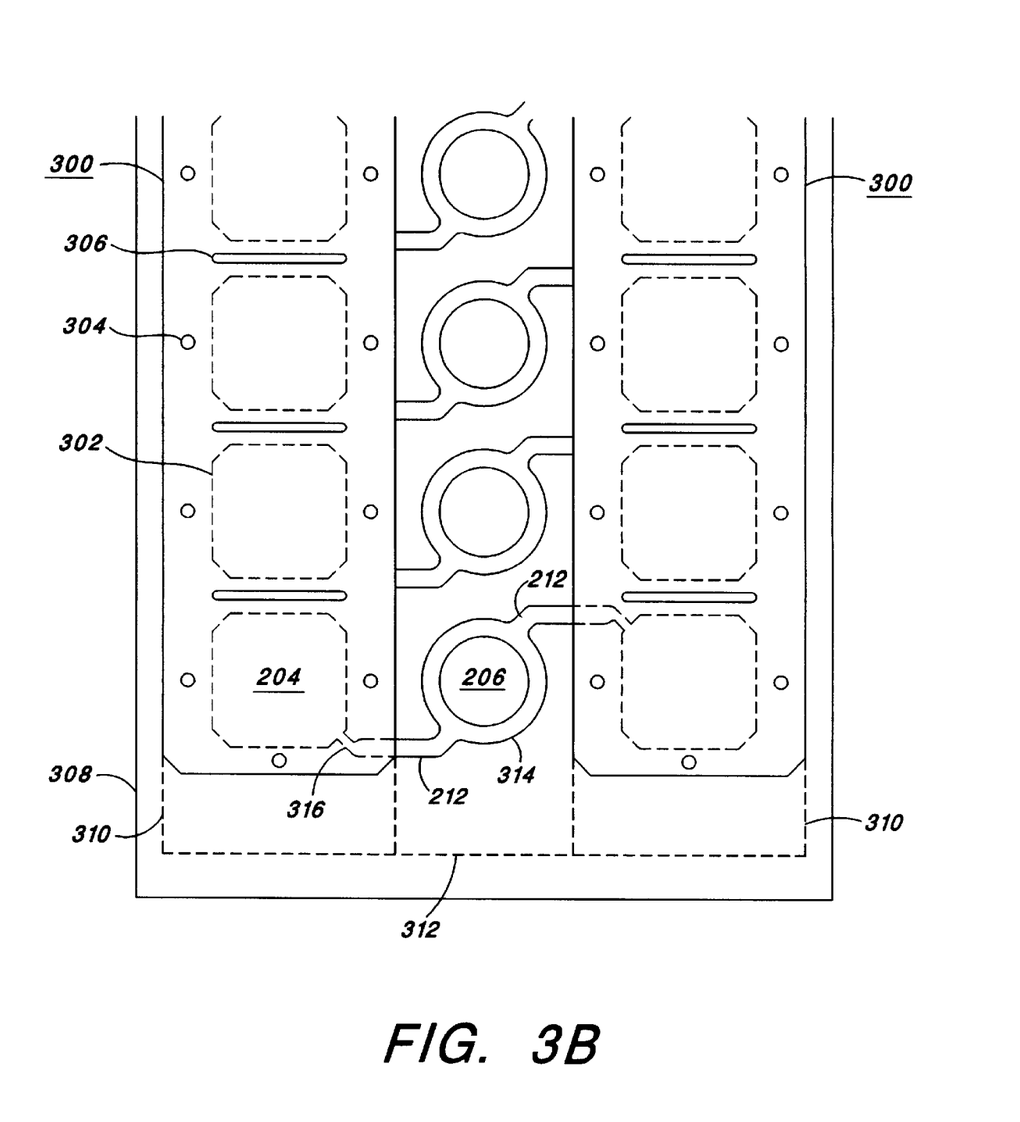
FIG. 3B is a top view of a chase having a pair of cavity bars and a runner bar fitted therein.

FIG. 3B is a top view of conventional molding equipment with substrate strips attached. As shown, the molding equipment includes a mold chase 308. The mold chase allows attachments of cavity bars 310 on each side which are separated by runner bar 312. Substrate strips 300 are attached to cavity bars 310 by tooling holes 304 which fit over corresponding pins projecting from the top surface of the cavity bars 310. Slots 306 are, again, provided between the substrates 302 to help prevent warping of the strip 300.

Each substrate 302 is aligned with a cavity 204 (indicated by dotted lines) formed on the cavity bar 310. The strips 300 are disposed on the cavity bars 310 such that the upper, or die attach surface, faces the top surface of the cavity bar 310. Thus, the die and bond wires mounted to each of the substrates will be enclosed by the cavity 204. For simplicity, only one cavity is denoted by the numeral 204. It is to be understood, however, that the other cavities illustrated in the figure are substantially similar, and the following description is equally applicable to them.

Cavity 204 is connected by runner channel 212 to pot 206. Pot 206 is one of four substantially similar pots formed on runner bar 312. Each pot feeds two cavities on either side of the runner bar 312. However, this is for purposes of illustration, and numerous other arrangements are known in the art. Runner channel 212 joins cavity 204 at gate 316.

Since the molding operation is substantially the same for each of the substrate strips 300, it will be described with respect to a single package substrate 204 and its associated molding material pot 206, for the sake of simplicity. After the substrate strips 300 are attached to the cavity bars, the molding material is placed into the pot 206, and the bar containing the lower mold sections are pressed against the cavity and runner bars shown in the figure. This holds the substrate strips 300 firmly in place. Transfer rams (not shown) are then pushed into the pot 206 in order to force the mold material through runner channel 212 and gate 316 and into cavity 204. A sufficient amount of material is forced into cavity 204 to completely fill the cavity and enclose the die and bond wires (not shown) on the package substrate 302. After the mold material cures, the bars are separated and the substrate strips 300 removed. The package substrate 302 is then singulated by punching it out of the strip 300, resulting in a molded semiconductor die, such as that shown in the cross-section view of FIG. 1.

However, one shortcoming of the above process is apparent. Specifically, the mold material not only fills the cavity 204 but also the gate 316, runner channel 212 and pot 206. Therefore, when the mold material is cured, the cured material not only covers the die and bond wires, but also extends along the surface of the package substrate and outward from the package along the runner channel 212 to the pot 206. This excess cured material is often referred to as the "runner" and must be removed from the substrate strips before they are singulated.

Accordingly, gate 316 is generally made somewhat smaller in cross-sectional area than the runner in order to assist in the "degating" process, i.e., the removal of the excess material. Generally, the degating process is performed simply by peeling the runner away from the substrate until it separates at the gate. However, the mold material tends to adhere to the surface of the package substrate during the degating process. This adhesion is likely to cause damage to the surface of the package substrate as the mold material is peeled away due to tearing or rupturing of the substrate. The damage may be merely cosmetic, or if severe enough, may fracture the substrate or damage electrically conductive traces on the substrate surface, resulting in functional damage to the substrate. Additionally, peeling away the runner may also tear away part of the solder mask on the substrate surface, exposing the metal traces underneath to oxidation, or attack by other chemical pollutants. Even if no damage is done to the package substrate, the degating process may still weaken the seal between the molded body and the upper surface of the substrate, thus increasing the chances of moisture penetration in the package.

Efforts at addressing this problem involve providing a metallic trace, such as gold, on the upper surface of the package substrate which contacts the gate and runner. Since conventional molding materials do not adhere well to gold, it is easier, and less likely to cause damage, to peel away the runner. However, adding such an additional trace increases the overall cost of the package. Moreover, the trace also requires the use of a substantial amount of area on the package substrate, thus reducing the total amount of available area for routing conductive traces to be used for electrical connections on the package. Therefore, there is a need for a semiconductor package which allows easy removal of the runner without risk of damage to the package substrate. It is also desirable that such a package will not require additional manufacturing step, or a reduction in the amount of available area for routing conductive traces.

SUMMARY OF THE INVENTION

It is an object of the invention to provide a semiconductor package which overcomes deficiencies of conventional packages described above. Further objects and advantages of the invention will become apparent in view of the following disclosure. In one embodiment, the invention provides a semiconductor package which allows the runner to be separated from the package along a package edge, rather than requiring it to be peeled away from the upper surface of the package. This greatly reduces the risk of damage to the package substrate due to the adherence of the runner. More specifically, a molded covering, sometimes referred to as the molded body, is formed on top of the upper surface of the package substrate in a manner similar to conventional semiconductor packages, such as BGA's. However, the gate area where the runner joins the molded body is extended outward from the molded body to the edge of the substrate. This extension will be referred to frequently as the mold gate runner. The mold gate runner is designed to allow the package to separate from the runner along an edge of the package substrate, without leaving burrs or rough edges which could interfere with other automatic equipment which may be used to handle the semiconductor package. To this end, the cross-sectional area of the mold gate runner is relatively wide and thin along the edge of the semiconductor substrate where the mold gate runner joins the runner. Also, a notch is provided in the upper surface of the mold gate runner which runs parallel to the edge of the package substrate. This notch facilitates the separation of the package from the runner along a plane perpendicular to the edge of the package substrate. The notch is formed in such a way that the resulting face of the mold gate runner, after separation from the runner, is flush with the edge of the package substrate and substantially smooth. This prevents rough edges which could cause problems in the automatic package handling equipment, such as marking machines, for example, the Dong-Yang SF-110-1R, solder ball attach machines, for example, the Shibuya SBM-200, or singulation machines, for example, the Intercon MA-3700.

Still another aspect of the invention relates to a method for fabricating a molded body covering on top of a semiconductor package. In this version of the invention, a cavity bar is provided for use in a two piece mold process. The cavity bar has a molded body forming cavity and a channel machined therein which connects the cavity to the runner channel. The runner channel is connected to the pot to allow transfer of the molding material. The shape of the channel determines the shape of the mold gate runner of the package. Accordingly, the channel is essentially a negative "image" of the mold gate runner. Advantageously, the cavity bar is designed to fit within the chase of conventional transfer molding equipment and has a number of cavities to permit simultaneous molding of multiple packages. Suitable commercial transfer molding equipment is commercially available for example, the APIC-Yamada model MS-7100F Auto-molding System. Once the cavity bar is installed in the chase, the remaining steps in the transfer molding process may be performed according to well known techniques.

Of course, numerous variations of the invention are possible which provide other improvements and advantages over conventional devices. Some of these variations and the advantages thereof will become more apparent in view of the following detailed disclosure of particular embodiments.

DETAILED DESCRIPTION OF EMBODIMENTS OF THE INVENTION

Figure 4A:
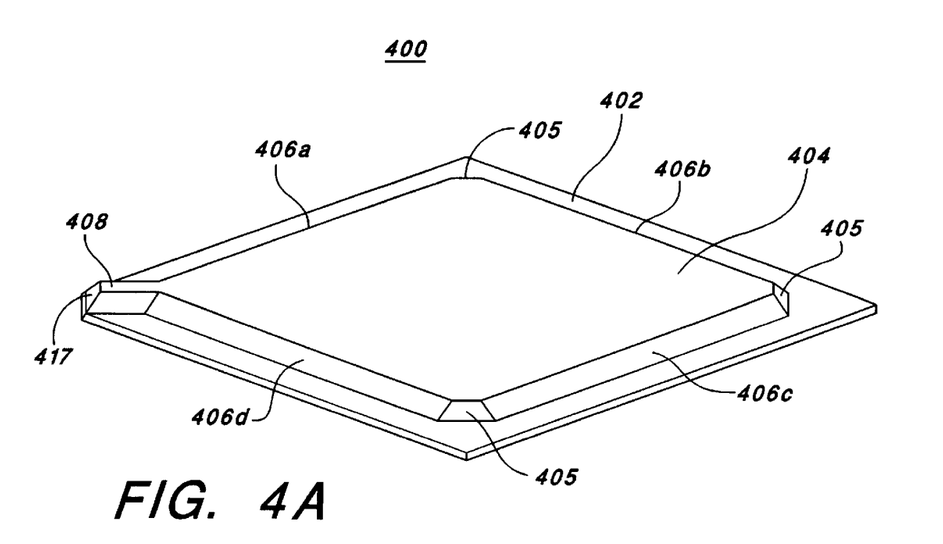
FIGS. 4A and 4B are perspective views of packages according to embodiments of the invention.

Referring now to FIG. 4A there is shown a perspective view of a molded. BGA package 400 according to an embodiment of the invention. The package 400 includes a laminated printed circuit board ("PCB") substrate 402 having conductive traces, vias, and an attached semiconductor die (enclosed within the molded body 404) as described with respect to the BGA package shown in FIG. 1. The substrate 402 is typically covered with a solder resistant material, such as PSR 4000, commercially available from Taiyo Ink Corp. The solder resist prevents corrosion and oxidation of the metallic traces formed on the surface of the substrate 402. The lower side of the substrate 402 is provided with a plurality of electrical contacts to establish electrical connection to external electronic components, such as printed wiring boards ("PWB"). Suitable connecting structures for providing the electrical connection between the package 400 and external electronic components, such as solder balls or pins, may be mounted to the electrical contacts on the lower surface of the package 400 by conventional techniques, such as reflow soldering. The substrate 402 is constructed from a suitable laminate material, such as an epoxy-glass. In one particular embodiment, the substrate 402 is manufactured from CCL-HL832 BT laminate, commercially available from Mitsubishi Gas and Chemical Corp., although numerous other suitable materials will occur to those of skill in the art.

A molded body 404 is formed on the upper surface of the package substrate 400 to protect the semiconductor die mounted to the surface of the substrate 402. The material used to form molded body 404 is not critical, and any commercially available plastic or encapsulant materials may be used as a matter of design choice, such as "SMT-B1," commercially available from Plaskon Corp. The height of the molded body 404 from the top surface of the substrate 402 must be sufficient to fully cover the die and bond wires attached to the substrate 402. In the embodiment shown, the molded body 404 has four sides 406a–406d which are provided with a slight slope to facilitate removal of the semiconductor package 400 from the cavity bar. Also, in this embodiment, the corners 405 of the molded body 404 are "clipped" so that the sides of the body 404 do not intersect at right angles. This is useful to prevent the intrusion of moisture between the junction of the molded body 404 and the upper surface of the substrate 402.

In the embodiment shown in FIG. 4A, one corner of the molded body 404 is extended to form a mold gate runner 408. The mold gate runner 408 extends to the edge of the substrate 402 as shown. In this particular embodiment, it is seen that the outward facing edge 417 of the mold gate runner 408 and the corner of the package substrate 402 are both clipped in a manner similar to that described above.

Thus, the facing edge of the mold gate runner 408 shares only a single edge with the package substrate. Since the mold gate runner 408 remains on the upper surface of the substrate 402, there is no danger that the substrate 402 will be damaged by the degating process. Of course, it is important that the mold gate runner 408 be created in such a manner that the runner (not shown) is easily removable at the outward extending face 417. This will be described in greater detail herein.

Figure 4B:
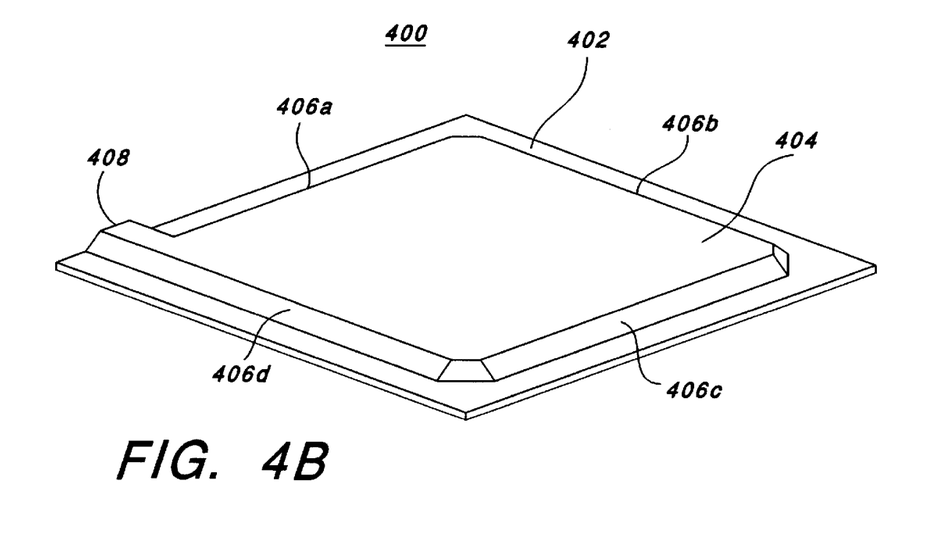

FIG. 4B is a perspective view of a semiconductor package according to a different version of the invention. In this case, the package 400 is similar to the one shown in FIG. 4A in that it includes a package substrate 402 having a molded body 404 formed thereon which has four sloped sides 406a–406d. However, in this case the mold gate runner 408 extends perpendicularly from a corner of the molded body 404 to the edge of the package substrate 402.

Figure 5:
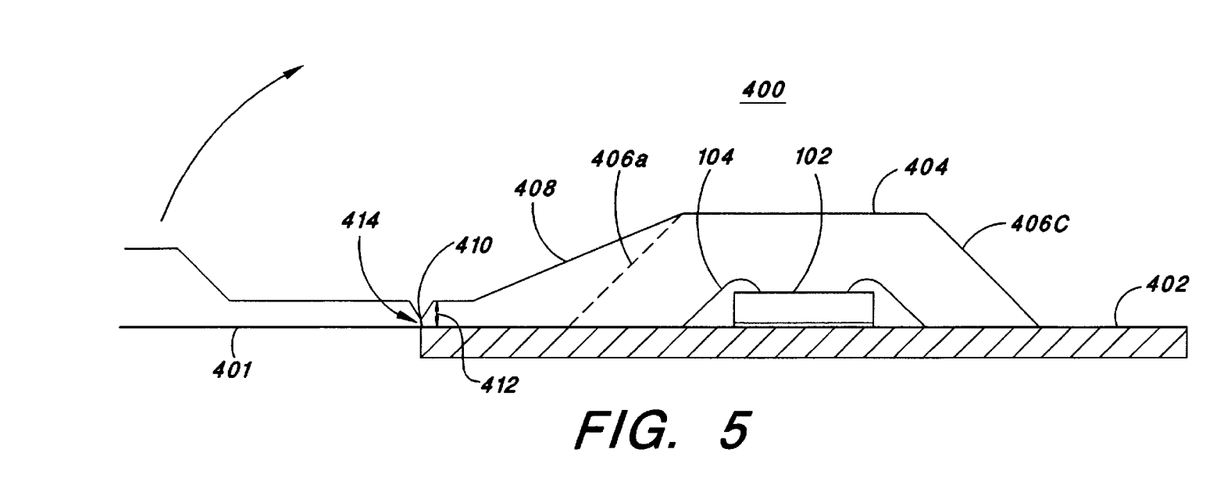
FIG. 5 is a cross-sectional view of a package according to an embodiment of the invention.

Referring now to FIG. 5, there is shown an edge view of the package depicted in FIG. 4B taken along edge 406d of the molded body 404. In this view, the semiconductor die 102 and bond wires 104 are shown mounted to the upper surface of the substrate 402 to illustrate the respective positions within the molded body 404. The slope provided to the sides of molded body 404 is clearly seen in this figure with respect to sides 406a and 406c. In one embodiment, the slope of the sides is between about 10° and about 15° from the perpendicular. A smaller slope angle is desired for mechanical strength, however, too small of a slope angle, e.g., below 7°, will make it difficult to remove package 400 from the mold.

The mold gate runner 408 extends from the side of mold body 404 to the edge of the package substrate 402 where it joins with the runner 401 which remains attached to the package 400 after removal from the mold. A depression, in this case a "V" notch, 410 is formed between the mold gate runner 408 and the runner 401 so that when a bending force in the direction indicated by the arrow is applied to the runner 401, it snaps or breaks cleanly from the mold gate runner 408 along a line perpendicular to the bottom of the notch 410. Although depicted as a "V" notch, it will be clear to those of skill in the art that other notch cross-sections, such as "U" or rectangular shapes, could easily be substituted for the "V" notch 410 depicted in the figure. It is to be understood that the exact cross-section of the notch 410 is not critical as long as it provides a sufficient concentration of forces to cause a smooth, perpendicular break at the edge of the package substrate to separate the runner 401.

It is important that during the degating process, the runner 401 is detached from the mold gate runner 408 in such a way that no rough edges or burrs are left on the face of the mold gate runner 408, or that the mold gate runner 408 extends unacceptably beyond the edge of the substrate 402. This is because modern semiconductor handling processes are largely automated, and the automation equipment relies on accurately sized semiconductor packages which do not have rough edges, or burrs, which could cause the equipment to malfunction. Thus, in order to ensure the degating process results in a suitable detachment of the runner 401, it is important that the dimensions of the notch 410 including the height of the 412 and distance between the bottom of the 410 and substrate 402 be accurately controlled when the molded body 404 is formed.

Figure 6:
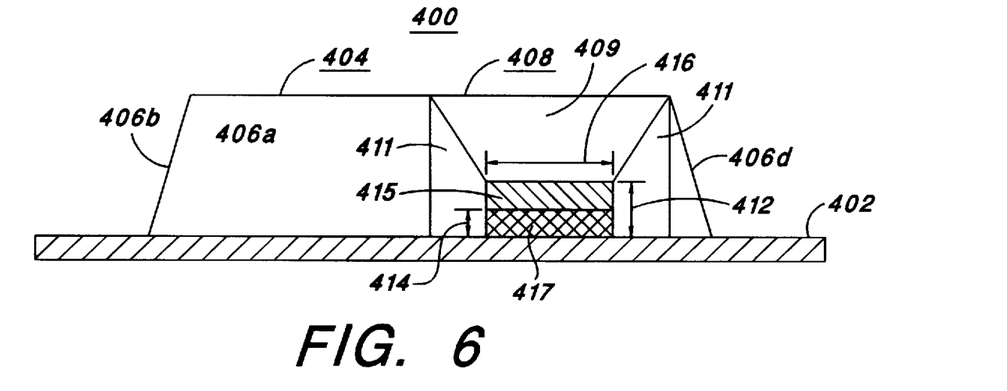
FIG. 6 is a side view of the package shown in FIG. 5.

Referring now to FIG. 6, there is shown an edge view of a semiconductor package shown in FIG. 4B taken along edge 406a. As seen in the figure, the mold gate runner 408 has a top surface 409 and two side surfaces 411 which extend to the edge of the substrate 402 from the side 406a of the molded body 404. In this embodiment, the upper surface 409 slopes downward, i.e., towards the upper surface of substrate 402, from the top of molded body 404. The sides 411 of the mold gate runner 408 slope towards each other so that the mold gate runner narrows as it approaches the edges of the substrate. The face of the mold gate runner is shown as it appears after degating. The face has two distinct sections. The first section 417 is desirably perpendicular to the upper surface of the substrate 402 and extends to a height 414 above the upper surface of the substrate 402. The second section of the face 415 is one-half of the notch 410 which slopes away from the edge of the substrate 402 towards the interior of the package. Of course, it will be recognized that the junction of the first section 417 and the second section 415 is the bottom of the notch. The height of the mold gate runner 408 at the top of the notch is shown by dimension 412.

Particular dimensions for the mold gate runner are, of course, largely a matter of design choice depending on the dimensions of the particular semiconductor package being fabricated. Moreover, designing the notch to provide a clean, perpendicular break is within the capabilities of a person of skill in the art who will be familiar with the fracture mechanics of the molding material used in specific implementations of the inventions. Detailed information concerning the physical characteristics of various molding materials, as well as formulas and equations required to perform the necessary calculations, is widely available to those in the art, for example, published by Joseph B. Dym, "Product Design with Plastics," ISBN 0-8311-1141-0, incorporated herein by reference. In one exemplary embodiment, for a semiconductor package having a thickness of about 1.2 mm., i.e., 0.047 inches, the overall height of the gate 412 is about two-thirds of the thickness of the molded body covering, or about 0.03 inches. In an even more specific embodiment, the gate is made somewhat thinner, and dimension 412 is between about 0.02 to about 0.025 inches. The width of the gate 416 in this embodiment is between about 0.060 and about 0.080 inches.

It is generally desirable that, in order to produce a perpendicular break, the notch in the upper surface of the gate extend more than half way into the gate. Thus, the height 414 of the face 417 of the mold gate runner is less than about half of the thickness of the height 412. For the mold gate runner described above, the height 414 is desirably between about 0.008 to about 0.010 inches in one advantageous embodiment.

Figure 7:
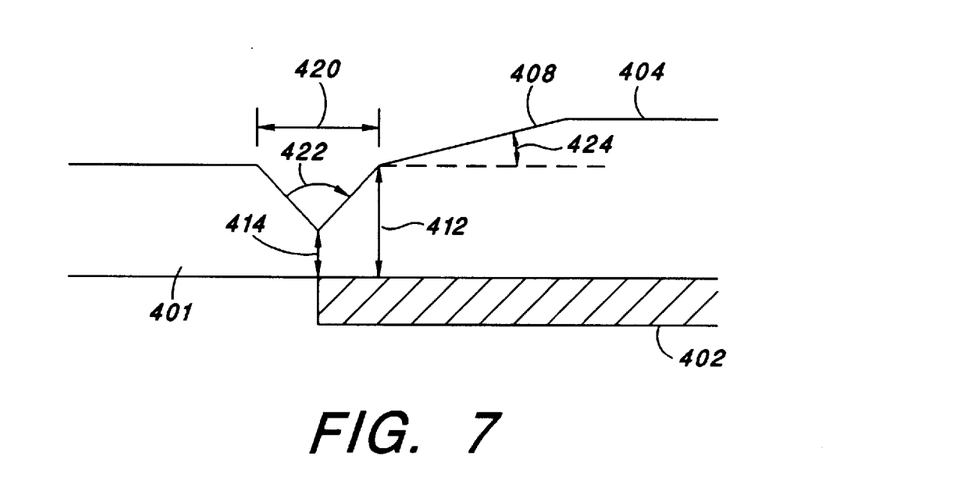
FIG. 7 is a cross-sectional view of a semiconductor package according to an embodiment of the invention illustrating a notch suitable for removing the runner.

Referring now to FIG. 7, there is shown a cross-sectional view of an exemplary mold gate runner 408 which illustrates other important aspects of the invention. In the figure, runner 401 is shown attached to mold gate runner 408. The notch is provided with a notch angle 422. The notch angle 422 must be sufficient to allow the bending of the runner 401 to cause the required stress concentration at the bottom of the notch to provide the desired break along the dimension 414. Similarly, the width of the notch 420 must also be sufficiently wide so that the desired stress concentration may be sufficient to cause the runner 401 to separate from the molded body 404 before the body 404 is lifted away from the substrate 402. In the exemplary embodiment described above, it is useful to provide a notch angle 422 of between about 60° and about 90°. The width of the notch 420, will largely be a function of the notch angle 422 and the height 414. In one embodiment, the width of the notch 420 is desirably between about 0.010 inches and about 0.012 inches. Also as shown in FIG. 7, it is seen the top surface of the mold gate runner 408 slopes downward to the notch. This slope is measured by angle 424. The angle is not critical and will be largely dependent on the desired dimensions of the mold gate runner and the notch.

Figure 8:
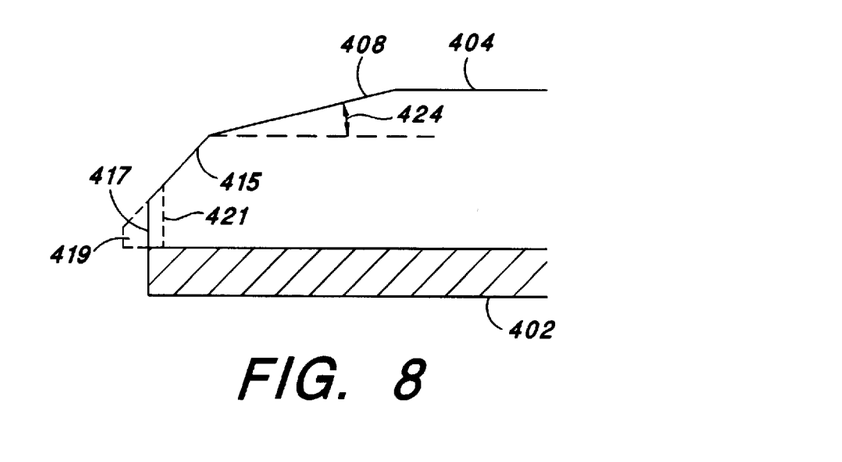
FIG. 8 is a side view of a semiconductor package according to an embodiment of the invention illustrating the desired placement of the front face of the mold gate runner.

Referring now to FIG. 8, there is shown a cross-sectional view of a mold gate runner 408 on a substrate 402 after the degating process. As discussed previously, it is desirable that the face 417 of the mold gate runner 408 is flush with, and perpendicular to the edge of the substrate 402. An overhang 419 is undesirable because this presents a protrusion which could catch or snag on portions of the automated handling equipment, resulting in a malfunction of the equipment. Similarly, if the face 417 has a set back 421 from the edge of the substrate 402, then there is a risk that the portion of the substrate edge could be damaged from the adhesive action of the mold material when the runner is peeled away. Thus, in order to ensure that the face 417 is properly located with respect to the substrate 402, the bottom of the notch must be properly aligned with the edge of the substrate 402 as indicated in the figure. In an alternate embodiment of the invention, it is desirable to provide a certain tolerance to ensure that regardless of the quality of the severance, there is no overhang from the semiconductor package which would interfere with automatic handling equipment. Thus, in one embodiment, it is desirable to position the bottom of the notch a certain distance away from the edge of the substrate, over the substrate surface. In one particular embodiment, the bottom of the notch is located about 0.002 inches from the edge of the substrate. In this way, if the break is rough, there is still a small tolerance to prevent an overhang off the package substrate.

Figure 9:
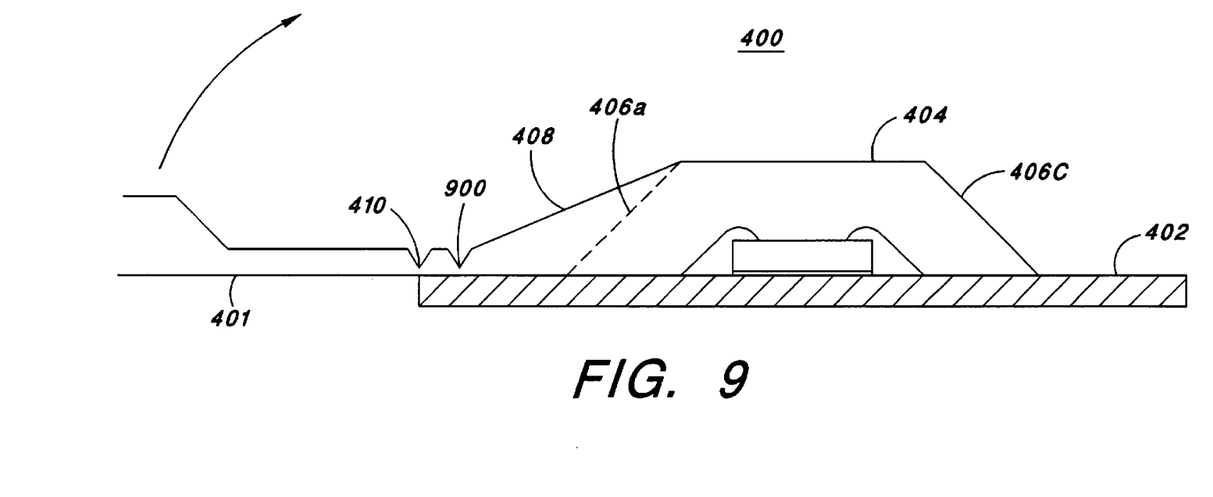
FIG. 9 is a cross-sectional view of a semiconductor package according to still a further embodiment of the invention.

Of course, it will be clear to those of skill in the art that numerous variations in the molded packaged geometry are possible which embody the concepts of the present invention. For example, referring now to FIG. 9, it is seen that an additional notch 900 is placed in the mold gate runner 408 behind the initial notch 410. If, for some reason, notch 410 fails when the runner 401 is bent as shown, notch 900 provides a second location where the separation of the runner 401 and the molded body 404 could take place. Otherwise, it is possible that efforts to degate the runner 401 could lift the molded body 404 away from the substrate, resulting in damage to the seal between the molded body 404 and the upper surface of the substrate 402. The dimensions of the second notch 900 are in accordance with the concepts discussed with respect to the first notch 410.

Figure 10:
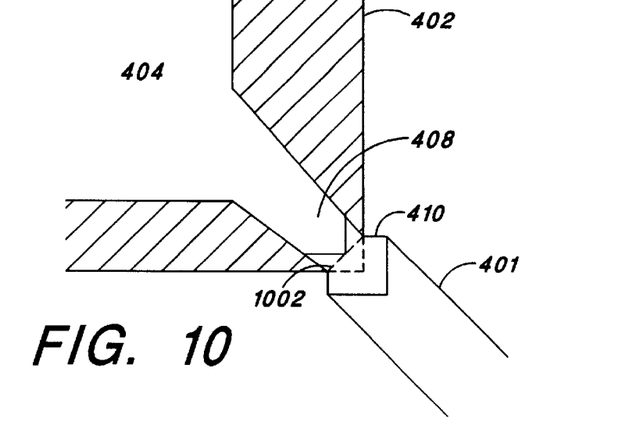
FIG. 10 is a top view of a semiconductor package according to an embodiment of the invention.

Similarly, other useful geometries for the molded body 404 and the mold gate runner 408 will occur to those of skill in the art. For example, referring now to FIG. 10 there is shown a top view of a semiconductor package having a molded body 404 formed on top of a substrate 402. One comer of the molded body 404 is extended to form the mold runner gate 408. A notch 410 joins the mold gate runner 408 to the runner 401. In this case, the notch 410 is shaped to conform to the corner of the substrate 402. In other words, the bottom of the notch 410 is an "L" or corner shape which corresponds to the outline of the comer of the substrate 402. In one particular embodiment, the dimensions of the notch are such that the cross-sectional area of the face of the mold gate runner 408 is the same as a similarly sized mold gate runner which only joins one edge of the package 402. Alternately, the comer of the substrate 402 may be clipped as indicated dash line 1002. In this embodiment, the notch and the mold gate runner would be provided with a straight bottom which conforms to the geometry of the substrate 402. This results in a semiconductor package substantially as shown in FIG. 4A.

Figure 11:
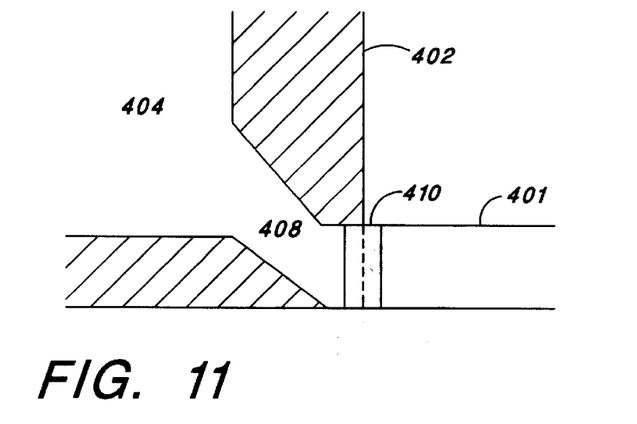
FIG. 11 is a top view of a package according to still a further embodiment of the invention.

FIG. 11 is a top view of a semiconductor package according to still a further embodiment of the invention. In this case, the mold gate runner 408 extends diagonally from a corner of the molded body 404. However, the mold gate runner 408 is arranged such that the V notch 410 is aligned with a single edge of the substrate 402. In this way, degating the runner 408 is performed only along a single edge.

Figure 12:
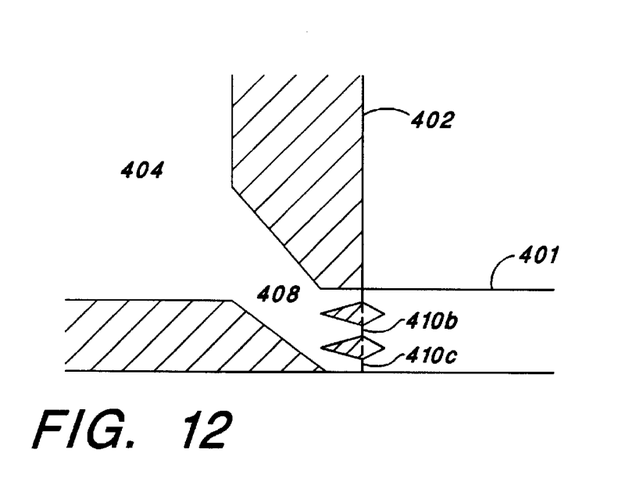
FIG. 12 is a top view of an embodiment of the invention having multiple fingers to allow separation of the runner at the edge of the package.

Yet another embodiment of the invention is shown in FIG. 12. In this case, the mold gate runner 408 is extended diagonally from a corner of the molded body 404 and aligned with a single edge of the substrate 402 in a manner similar to that shown in FIG. 11. However, the edge of the mold gate runner 408 is not continuous, but includes three separate "fingers" 410a, 410b and 410c which connect with the runner 401. Gaps of exposed substrate material appear between each finger. In this embodiment, the mold gate runner 408 is essentially perforated which allows even easier removal of the runner 401 since the cross-sectional area of the mold material which joins the mold gate runner 408 and the runner 401 is divided among the fingers.

Figure 13:
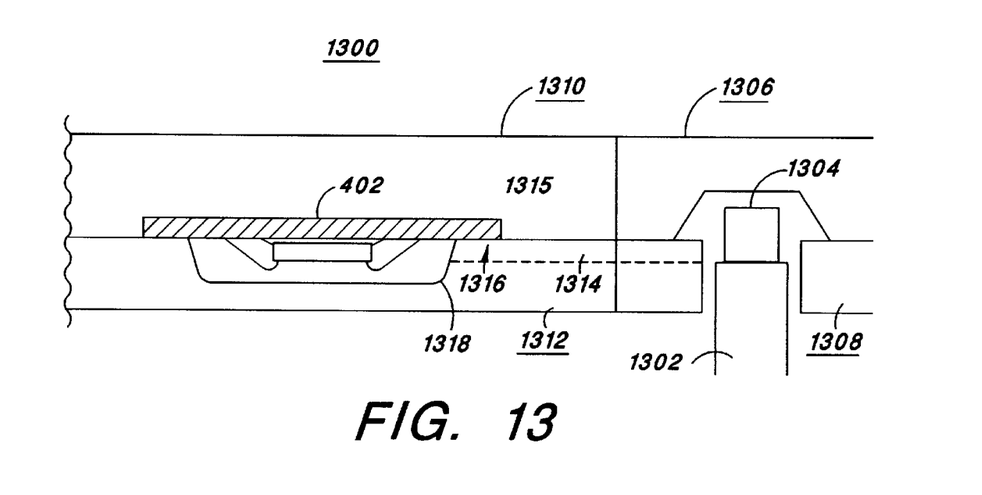
FIG. 13 is a cross-sectional view of a molding apparatus useful according to an embodiment of the invention.

Fabrication of semiconductor packages according to the present invention is performed in a manner similar to conventional transfer molding processes. FIG. 13 is a cross-sectional view illustrating a molding process according to an embodiment of the invention. As shown, the process is performed in molding equipment 1300. The molding equipment 1300 includes upper mold sections 1306 and 1310 and lower mold sections 1308 and 1312. Mold sections 1306, 1308, 1310 and 1312 are preferably designed as removable mold bars which fit within a chase (not shown). Platens (not shown) are used to force together the chases during the molding process, and separate the chases after the molding process is complete.

Upper mold section 1306 is sometimes referred to as the runner bar and contains a cavity for the insertion of a mold material 1304. Lower mold section 1308 mates with upper mold section 1306 and has an opening for the insertion of a transfer ram 1302 into the cavity into the upper mold section 1306. Lower mold section 1312, sometimes referred to the "cavity bar", mates with upper mold section 1310. Upper mold section 1310 has a recess formed therein for holding the substrate 402 of a semiconductor package to be encapsulated by the molding material 1304. Lower mold section 1312 has a cavity 1318 formed therein. The cavity 1318 is shaped such that its interior volume will shape the mold material, when filled, into shapes in accordance with the present invention. Most particularly, the cavity 1318 includes a mold gate runner cavity 1315 in the shape of a mold gate runner according to an embodiment of the invention. The notch 1316 is formed as shown between the mold gate runner cavity 1315 and the runner channel 1314. In operations, the mold sections 1306, 1308, 1310 and 1312 are assembled together as shown. The transfer ram 1302 is then pushed into the material cavity in order to cause mold material 1304 to flow through the runner channel 1314 into the gate 1315 and molded body cavity 1318. The amount of mold material 1304 is sufficient to completely fill cavities 1314, 1315 and 1318.

The mold material is then cured. Curing is performed according to known techniques which depend on a particular molding material use. For example, for Plaskon SMT-1B mold compound, it is desirable to cure the package for approximately four hours at a temperature of 175° C. After curing, the mold sections are separated and the package is removed. The runner is then degated from the package by applying a bending force as described previously.

After the degating process is complete, the individuals package substrates are separated from the substrate strip.

This separation process is referred to as singulation. Conventional singulation processes involve punching, sawing or snapping the package substrates out of the substrate strip. Punching typically uses a die set in a mechanical press. Suitable punching equipment is known in the art and commercially available from a variety of manufacturers including Kras Equipment, TOWA, and Yamada Corporations. After the singulation process is complete, the package is provided with electrical contacts, such as solder balls formed from a tin-lead alloy, in order to provide electrical connection between the semiconductor package and the printed wire board to which it is to be connected. The solder balls, and techniques for attaching them, are well known to those of skill in the art and will not be described further herein. Further, it within the abilities of those of skill in the art to modify the invention for other types of know electrical connections, such as conductive pins.

Since the mold gate runner is left on the upper surface of the package substrate, and not removed as in conventional packages, the mold gate runner is also useful as an orientation feature of the package for use in automatic packing equipment. For example, pick and place equipment, such as the Quad QSX-1 Assembler, is used to place the package onto printed wiring boards. Of course, it is critical that the orientation of the package is correct when it is placed on the printed wiring board, otherwise the pin-out will be incorrect and the board will be defective. The pick and place equipment could easily be modified by one of skill in the art to sense the mold gate runner on the substrate by known mechanical, or optical sensors, such as photo-transistors. The position of the mold gate runner in relation to the printed wiring board is then transmitted to the computer which operates the equipment. The computer then determines whether the semiconductor package is properly oriented, and if not, halts the assembly process and provides an appropriate warning signal to the machine operators.

Although the present invention has been described with respect to various particular embodiments, it will be understood by those of skill in the art that numerous variations are possible in the specific geometries, material selections, molding apparatuses and other details without departing from the scope and spirit of the present invention. All publications discussed herein are hereby incorporated by reference as though set forth in full.

What is claimed is:

1. A semiconductor package comprising:
    a laminated substrate having a semiconductor die mounted on an upper surface of the substrate;
    first electrical connections between bond pads on the semiconductor die and conductive traces on the upper surface of the substrate;
    second electrical connections between the conductive traces and electrical contacts on a lower surface of the substrate;
    a molded covering formed on the upper surface of the substrate which covers the semiconductor die and the first electrical connections, the molded covering having a mold body portion and a mold gate runner which extends from the mold body portion to an edge of the substrate, wherein the mold gate runner has a surface substantially even with the edge of the substrate and perpendicular to the upper surface of the substrate.

2. A semiconductor package as in claim 1 wherein the mold gate runner is provided with a notch to facilitate separation of the semiconductor package from a mold runner.

3. A semiconductor package as in claim 2 wherein the notch is substantially V-shaped in a cross-section taken perpendicular to the edge of the package of the substrate.

4. A semiconductor package as in claim 2 wherein a bottom surface of the notch is substantially superjacent to the edge of the substrate.

5. A semiconductor package as in claim 4 wherein a second notch is provided in the mold gate runner between the edge of the package substrate and the mold body portion.

6. A semiconductor package as in claim 1 wherein the surface of the mold gate runner comprises a plurality of adjacent surfaces, each being substantially even with the edge of the substrate.

7. A semiconductor package comprising:
    a substrate having an upper surface, a lower surface and a perimeter;
    a plurality of conductive traces formed on the upper surface;
    a plurality of electrical contacts on the lower surface of the substrate for attachment to a printed wiring board;
    a plurality of conductive vias through the substrate electrically connecting the conductive traces on the upper surface to the electrical contacts on the lower surface;
    a semiconductor die mounted on the upper surface, the semiconductor die in electrical communication with the plurality of traces;
    a molded body formed on the upper surface of the substrate covering the semiconductor die and traces; and
    a mold gate runner on the upper surface of the substrate extending from the molded body to the perimeter of the substrate.

8. The package of claim 7 wherein the electrical contacts are a plurality of solder balls.

9. The package of claim 7 wherein the electrical communication between the semiconductor die and the plurality of traces is bond wires.

10. The package of claim 7 wherein the perimeter of the substrate is a square.

11. The package of claim 10 wherein the molded body has a number of sides parallel to the perimeter of the substrate.

12. The package of claim 11 wherein the sides of the molded body have a slope.

13. The package of claim 10 wherein the mold gate runner extends to an edge of the square perimeter of the substrate.

14. The package of claim 10 wherein the mold gate runner extends to a corner of the square perimeter of the substrate.

15. The package of claim 7 wherein the perimeter of the substrate is a square and one corner of the square is clipped.

16. The package of claim 15 wherein the mold gate runner extends to the clipped corner of the square perimeter of the substrate.

17. A semiconductor package comprising:
    a substrate having an upper surface, a lower surface and a rectangular perimeter with one clipped corner;
    a plurality of conductive traces formed on the upper surface;
    a plurality of electrical contacts on the lower surface of the substrate for attachment to a printed wiring board;
    a plurality of conductive vias through the substrate electrically connecting the conductive traces on the upper surface to the electrical contacts on the lower surface;

a semiconductor die mounted on the upper surface, the semiconductor die in electrical communication with the plurality of traces;

a molded body formed on the upper surface of the substrate covering the semiconductor die and traces, the molded body having sloped sides parallel to the edges of the substrate; and a mold gate runner on the upper surface of the substrate extending from the molded body to the perimeter of the substrate.

18. The package of claim 17 wherein the mold gate runner extends perpendicular to an edge of the perimeter of the substrate.

19. The package of claim 17 wherein the mold gate runner extends from a corner of the molded body to the clipped corner of the perimeter of the substrate.

20. The package of claim 17 wherein the intersection of the sloped sides of the molded body are clipped to form clipped corners.

* * * * *